(12) United States Patent
Liaw

(10) Patent No.: US 7,621,762 B2
(45) Date of Patent: Nov. 24, 2009

(54) BGA SOCKET HAVING EXTENSIBLE SOLDER BALL SO AS TO COMPENSATE WARPAGE CONNECTOR HOUSING

(75) Inventor: Been-Yang Liaw, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/156,059

(22) Filed: May 28, 2008

(65) Prior Publication Data

US 2008/0299802 A1 Dec. 4, 2008

(30) Foreign Application Priority Data

May 28, 2007 (TW) .............................. 96118916 A

(51) Int. Cl.
*H01R 12/00* (2006.01)
*H05K 1/00* (2006.01)

(52) U.S. Cl. ....................................... 439/83; 257/738

(58) Field of Classification Search .................. 439/83; 257/738, E23.021; 438/613
See application file for complete search history.

(56) References Cited

U.S. PATENT DOCUMENTS

| 5,841,198 | A  | * | 11/1998 | Chia et al. | 257/780 |
|---|---|---|---|---|---|
| 6,002,168 | A  | * | 12/1999 | Bellaar et al. | 257/696 |
| 6,350,669 | B1 | * | 2/2002 | Pu et al. | 438/613 |
| 6,507,121 | B2 | * | 1/2003 | Huang | 257/780 |
| 6,610,591 | B1 | * | 8/2003 | Jiang et al. | 438/613 |
| 7,265,046 | B2 | * | 9/2007 | Kondo et al. | 438/614 |

FOREIGN PATENT DOCUMENTS

JP          2007214172 A   *   8/2007

* cited by examiner

*Primary Examiner*—Hae Moon Hyeon
(74) *Attorney, Agent, or Firm*—Andrew C. Cheng; Wei Te Chung; Ming Chieh Chang

(57) ABSTRACT

A solder ball is adapted for a ball grid array socket and comprises a core portion (1) and a layer (2) of solder alloy coated an outer surface of the core portion. The core portion is consisting of tin essentially, and the layer of solder alloy contains at least two metal materials.

7 Claims, 4 Drawing Sheets

US 7,621,762 B2

BGA SOCKET HAVING EXTENSIBLE SOLDER BALL SO AS TO COMPENSATE WARPAGE CONNECTOR HOUSING

BACKGROUND OF THE INVENTION

1. Field of the Invention

The present invention relates to an electrical connector connecting to a printed circuit board (PCB) by solder balls, especially to a ball grid array (BGA) socket having attached with a solder ball capable of providing extension so as to compensate warpage of the socket thereby ensuring reliable soldering with respect to solder pads on a printed circuit board.

2. Description of Related Art

As FIG. 1 shown, a conventional solder ball 10 contains a ball-shaped core portion 20 and a layer 30 of alloy solder coated an outer periphery of the core portion 20. The core portion is made from an alloy of tin (Sn) and other metal, such as SnPb, SnAg, SnAgCu. The core portion also can adopt copper(Cu) material for forming a high solder temperature. Said alloy core portion and copper core portion have a same high rigidity capability, which does not attract momentary stress when exterior force is exerted thereon. As a result, the stress is directly exerted on the soldering interface of the solder balls and the PCB and the soldering interface will rupture. And more, the alloy core portion will produce an inter-metallic compound (IMC) thereinside after a long and high temperature, and grains of IMC will enlarged resulting intensity descend of the solder ball. As a result, the solder ball will crack along the IMC during endure thermal fatigue stress.

Furthermore, the solder ball will bring out more disadvantage if it is copper cored solder ball. FIG. 1 shows the rupturing process when the solder ball has a copper core portion 20. When the electrical connector 40 is connecting with the PCB 70 in a solder reflow oven during SMT process, the insulating housing 50 of the connector is distorted upwards but the solder ball 10 remains as original ball since the copper core portion 20 has a higher temperature than the periphery temperature. So the solder joint of the solder balls and the PCB will disconnect.

Therefore, an improved solder ball is desired to overcome the disadvantages of the prior arts.

SUMMARY OF THE INVENTION

An object of the present invention is to provide solder balls with improved impact-resistance and thermal-fatigue-resistance property.

Another object of the present invention is to provide solder balls, which improve mechanical property of a solder joint.

Third object of the present invention is to provide an electrical connector, which is connecting with a PCB by improved solder balls.

In order to achieve above-mentioned object, a solder ball comprises a core portion and a layer of solder alloy coated an outer surface of the core portion. The core portion is consisting of tin essentially, and the layer of solder alloy contains at least two metal materials.

Other objects, advantages and novel features of the present invention will become more apparent from the following detailed description of the present embodiment when taken in conjunction with the accompanying drawings.

DETAILED DESCRIPTION OF THE INVENTION

Figure 1:
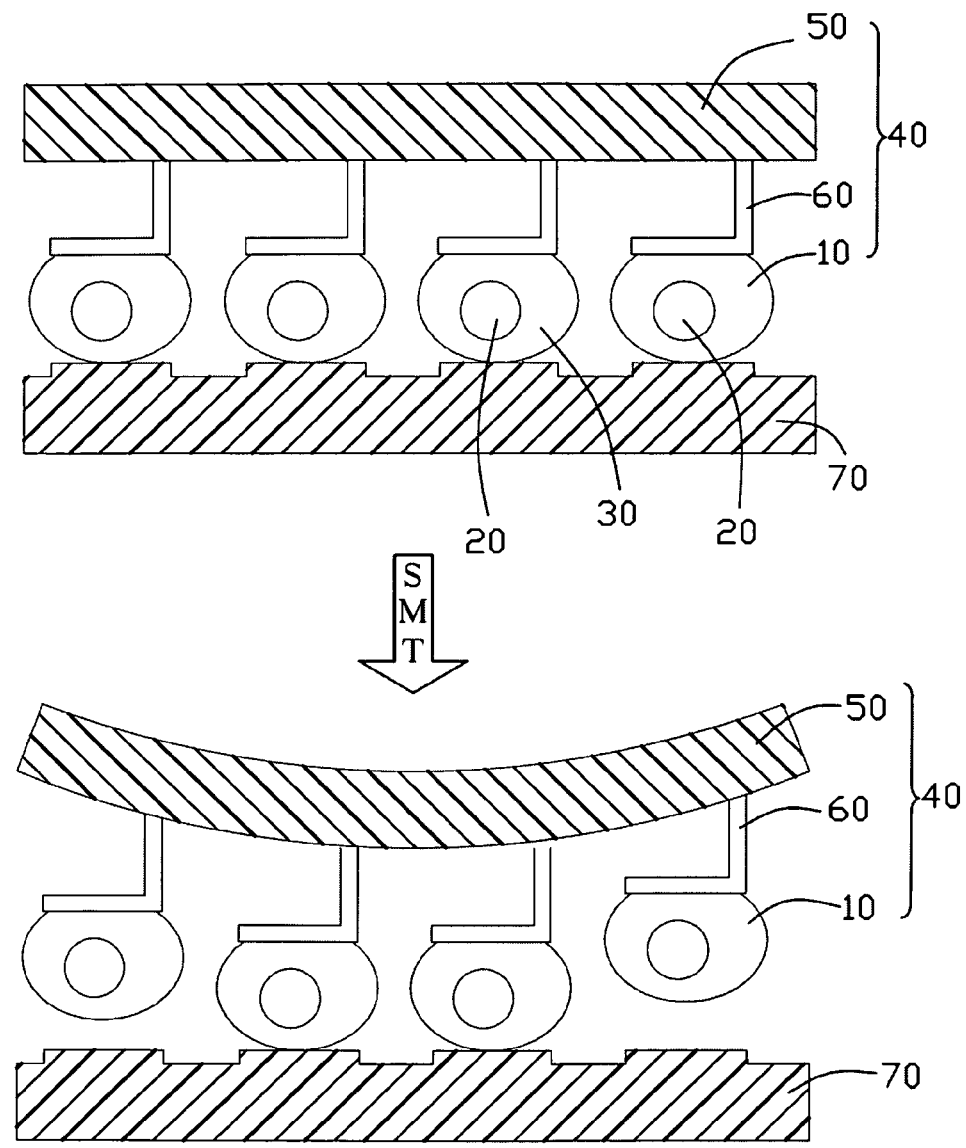
FIG. 1 is a schematic view shown an assembly of an electrical connector being connected to a PCB by conventional solder balls, wherein the connector is not completely connecting with the PCB.

Reference will now be made to the drawing figures to describe a preferred embodiment of the present invention in detail.

Figure 2:
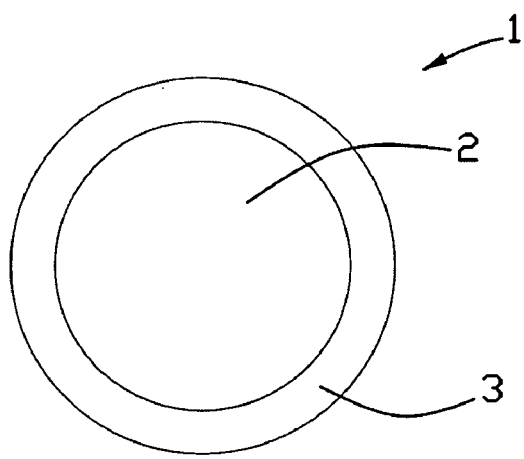
FIG. 2 is a schematic view of a solder ball embodying the present invention.

Referring to FIG. 2, a solder ball 1 in accordance with the present invention comprises a core portion 2 of a ball shape and a layer 3 of solder alloy coated to an outer periphery of the core portion 2. The core portion 2 is consisting of tin essentially. The melting temperature of the solder layer 3 is lower than that of the tin core portion.

The solder layer 3 is made from an alloy of at least two metal materials, such as SnPb, SnAg, SnAgCu, SnZnBi, SnAgCuSb. The solder layer 3 can be formed by plating, namely, the tin core portion 2 is put into a solution having solder alloy compound and the soldering alloy compound deposits on the outer surface of the tin core portion during transferring current, thereby forming the solder layer 3. Alternatively, the solder layer 3 is formed by another method of Physical Vapor Deposition (PCD), namely, the tin core portion is placed in a vacuum container and heat the solder alloy, the boiling away solder alloy is layered over the outer surface of the tin core portion, thereby forming the solder layer 3.

Figure 3:
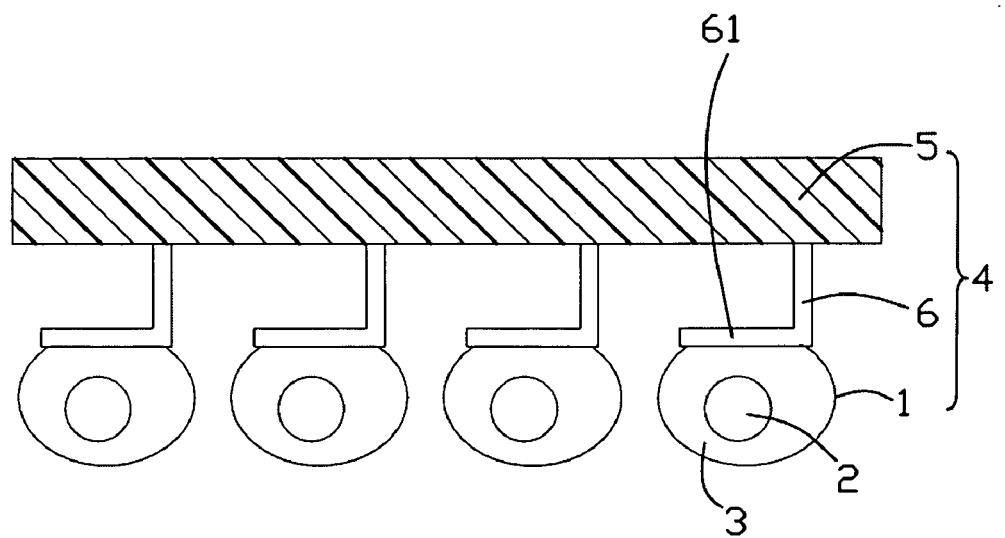
FIG. 3 is a schematic view of an electrical connector using the solder balls.
Figure 4:
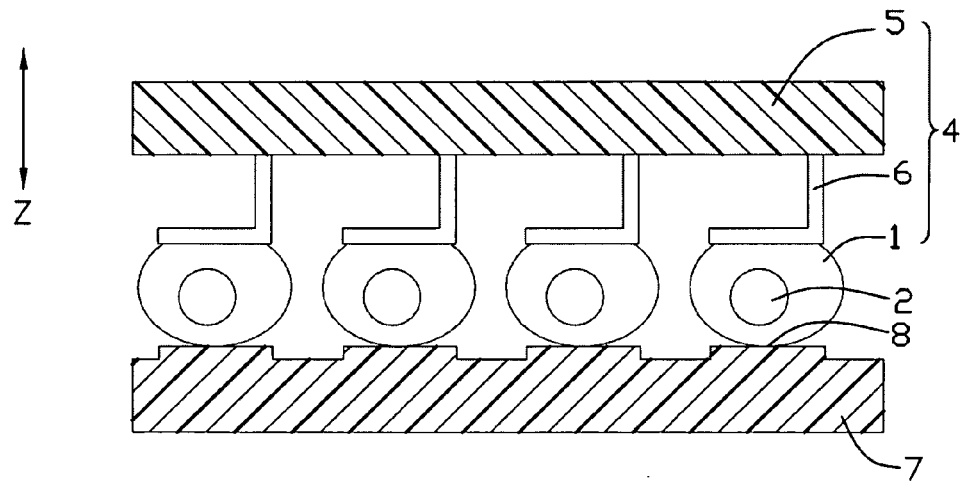
FIG. 4 is a schematic view of the electrical connector when an exterior force is exerted thereon.
Figure 5:
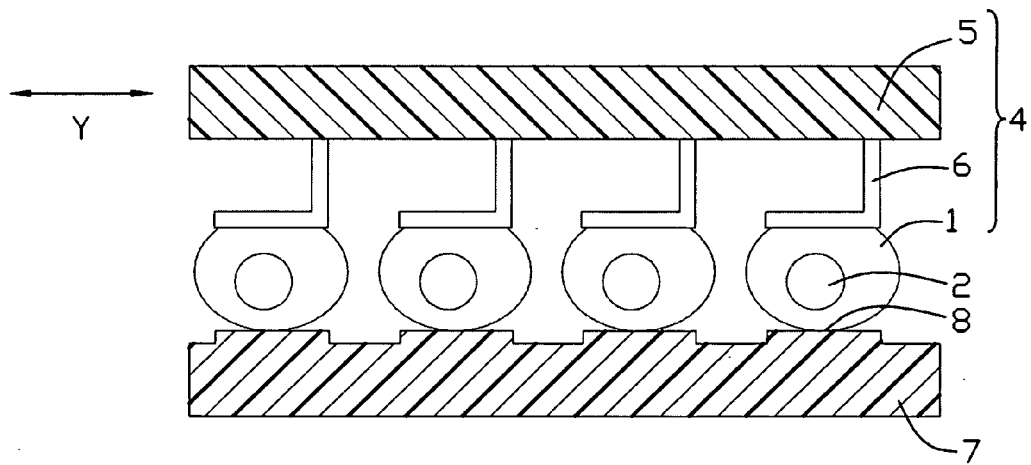
FIG. 5 is a schematic view of the electrical connector enduring thermal fatigue stress.

Referring to FIG. 3, the plurality of the solder balls 1 are used in an electrical connector 4, especially a BGA socket, to connect the connector with a PCB. The electrical connector 4 comprises an insulating housing 5 and a plurality of conductive terminals 6. The conductive terminal 6 is retained in the housing and has a L-shaped solder leg 61 extending out of the housing with a downward solder plane. The aforementioned solder balls 1 are attached with corresponding solder legs of the terminals at the solder plane by a conventional first reflow technology. Referring to FIGS. 4 and 5, the connector 4 with the solder balls 1 is placed to connect with the PCB 7 by a conventional second reflow technology.

The tin core portion has better plasticity property and can attract momentary stress, namely, the solder ball has a good impact resistance. See FIG. 4, the connector will endure exterior force along up-and-down direction (allow Z), the solder balls will attract main stress exerted thereon. Therefore the solder joint 8 of the solder ball 1 will not rupture. And the solder ball will not produce IMC since the core portion is pure tin without grains expand problem, namely, the solder ball has a good thermal fatigue resistance. See FIG. 5, even if electrical connector will endure a thermal fatigue stress along the left-and-right direction (allow Y), the solder ball will not rupture inside for without IMC problem. Therefore, the solder joint 8 of the solder balls and the PCB will not crack. The tin-cored solder balls improve the mechanical property of the solder joint 8.

Figure 6:
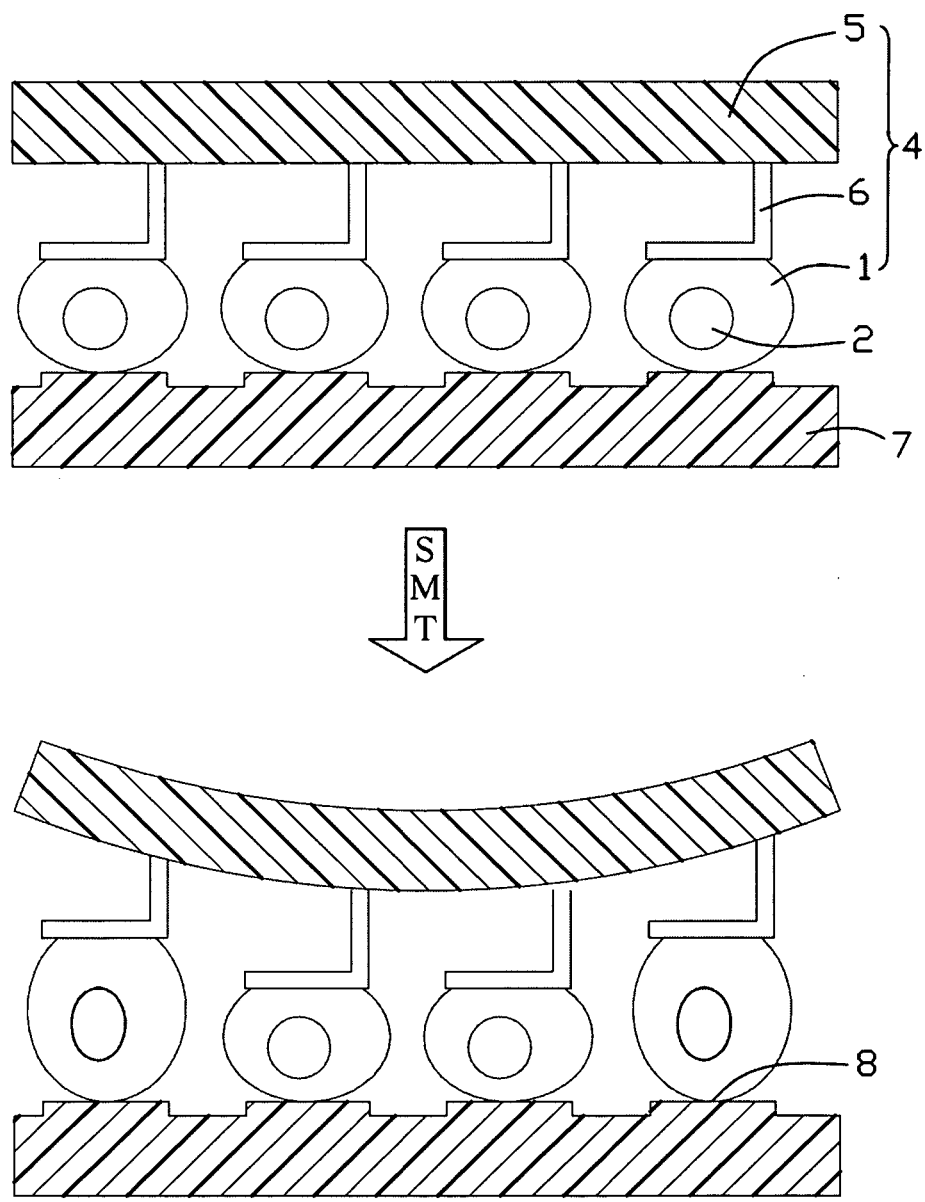
FIG. 6 is a schematic view shown an assembly of the electrical connector being connected to a PCB by the solder balls of the invention, wherein the connector is completely connecting with the PCB.

REFERRING TO FIG. 6, during the assembly of the connector 4 being connected to the PCB 7 by SMT, the tin core portion 2 will melt and deform along deformation and warp of the housing 5 of the connector 4 since the melting temperature of the tin core portion is slight lower than surface temperature of the oven. For example, during SMT process the outer periphery of the housing will warps upwards as best shown in FIG. 6, the tin core portion corresponding the out periphery of the housing will become oval in the up-and-down direction so that the solder points 8 of the solder balls and the PCB 7 are easily formed to establish an electrical connection therebetween. Alternatively, the core portion may extends transversely to decrease its height if the housing warp downwards. The solder ball is extensible so as to overcome the warpage of the housing and ensure reliable soldering.

However, the disclosure is illustrative only, changes may be made in detail, especially in matter of shape, size, and arrangement of parts within the principles of the invention.

What is claimed is:

1. A solder ball adapted for used with a ball grid array socket, comprising:
    a core portion consisting essentially of tin;
    a layer of solder alloy coated to an outer surface of the core portion, and containing at least two different metallic materials.

2. The solder ball as described in claim 1, wherein the layer of solder alloy is selected from one of SnPb, SnAg, SnAgCu, SnZnBi and SnAgCuSb.

3. The solder ball as described in claim 1, wherein the core portion is ball shaped.

4. An electrical connector, comprising:
    an inaulative housing having a bottom surface;
    a plurality of conductive terminals assembled in the insulative housing, and each contact terminal including a tail portion extending substantially toward the bottom surface; and
    a plurality of coated solder ball attached to each of the tail portion of the conductive terminal, wherein the solder ball is extensible so as to overcome the warpage of the housing wherein the coated solder ball has a tin core portion and a layer of solder alloy, the layer is coated to the tin core portion.

5. The electrical connector as described in claim 4, wherein the tin core portion is ball shaped.

6. The electrical connector as described in claim 4, wherein the solder ball locating an outer side of the housing is higher than other in a warpage direction of the housing.

7. An electrical connector assembly comprising:
    a printed circuit board;
    a connector including an insulative housing located above said printed circuit board;
    a plurality of contacts retained to the housing and extending downwardly to said printed circuit board under the housing; and
    each of said contacts being equipped with a solder ball unit including a core portion consisting essentially of tin coated by a solder alloy layer; wherein
    said core portion defines a relatively low melting point, thus allowing to be melted and deformed with the solder alloy layer to forgive variant distance between the housing and the printed circuit board due to warping of the housing resulting from heat generated by a surface mount process when assembling the connector to the printed circuit board.

* * * * *